(12) United States Patent
Tanaka et al.

(10) Patent No.: US 9,034,774 B2
(45) Date of Patent: May 19, 2015

(54) FILM FORMING METHOD USING PLASMA

(75) Inventors: Kouji Tanaka, Miyagi (JP); Hirokazu Ueda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/113,134

(22) PCT Filed: Apr. 23, 2012

(86) PCT No.: PCT/JP2012/060834
§ 371 (c)(1),
(2), (4) Date: Oct. 21, 2013

(87) PCT Pub. No.: WO2012/147680
PCT Pub. Date: Nov. 1, 2012

(65) Prior Publication Data
US 2014/0051263 A1     Feb. 20, 2014

(30) Foreign Application Priority Data

Apr. 25, 2011   (JP) .................................. 2011-096753

(51) Int. Cl.
*H01L 21/31*     (2006.01)
*H01L 21/316*    (2006.01)
(Continued)

(52) U.S. Cl.
CPC ............ *H01L 21/316* (2013.01); *C23C 16/345* (2013.01); *C23C 16/4554* (2013.01); *C23C 16/511* (2013.01); *H01L 21/02164* (2013.01); *H01L 21/0217* (2013.01); *H01L 21/02211* (2013.01); *H01L 21/02274* (2013.01); *H01L 21/0228* (2013.01); *H01L 21/318* (2013.01)

(58) Field of Classification Search
CPC .................................. H01L 21/30; H01L 21/31
USPC ................................................... 438/758, 778
See application file for complete search history.

(56) References Cited

U.S. PATENT DOCUMENTS 6,144,060 A * 11/2000 Park et al. ..................... 257/310
7,365,027 B2 * 4/2008 Ahn et al. ...................... 438/783
(Continued)

FOREIGN PATENT DOCUMENTS

JP   2007-138295 A   6/2007
JP   2009-509039 A   3/2009
(Continued)

OTHER PUBLICATIONS

International Search Report mailed Jun. 12, 2012 in PCT/JP2012/060834.

*Primary Examiner* — Caleb Henry
(74) *Attorney, Agent, or Firm* — Rothwell, Figg, Ernst & Manbeck, P.C.

(57) ABSTRACT

This film forming method comprises: a first material gas supply step (A) wherein a first raw material gas is supplied over the substrate to be processed so that a first chemical adsorption layer, which is adsorbed on the substrate by means of the first raw material gas is formed on the substrate to be processed, a second material gas supply step (C) wherein a second raw material that is different from the first raw material gas is supplied over the substrate, on which the first chemical adsorption layer has been formed, so that a second chemical adsorption layer, which is adsorbed by means of the second raw material gas, is formed on the first chemical adsorption layer; and a plasma processing step (E) wherein a plasma processing is carried on at least the first and second chemical adsorption layers using microwave plasma.

7 Claims, 5 Drawing Sheets

(51) Int. Cl.

| | | |
|---|---|---|
| C23C 16/34 | (2006.01) | |
| C23C 16/455 | (2006.01) | |
| C23C 16/511 | (2006.01) | |
| H01L 21/02 | (2006.01) | |
| H01L 21/318 | (2006.01) | |

(56) References Cited

U.S. PATENT DOCUMENTS

| | | | | |
|---|---|---|---|---|
| 7,511,326 | B2* | 3/2009 | Ahn et al. | 257/310 |
| 7,601,648 | B2* | 10/2009 | Chua et al. | 438/763 |
| 8,084,368 | B2* | 12/2011 | Hatanaka et al. | 438/758 |
| 8,102,013 | B2* | 1/2012 | Ahn et al. | 257/411 |
| 2004/0113227 | A1* | 6/2004 | Goto et al. | 257/506 |
| 2005/0271813 | A1* | 12/2005 | Kher et al. | 427/248.1 |
| 2007/0065578 | A1 | 3/2007 | McDougall | |
| 2007/0066077 | A1* | 3/2007 | Akasaka et al. | 438/710 |
| 2007/0197398 | A1* | 8/2007 | Kojima et al. | 505/473 |
| 2008/0026553 | A1* | 1/2008 | Chua et al. | 438/591 |
| 2008/0124945 | A1 | 5/2008 | Miya et al. | |
| 2009/0308840 | A1 | 12/2009 | Kohno et al. | |
| 2010/0068891 | A1* | 3/2010 | Hatanaka et al. | 438/758 |
| 2011/0024857 | A1* | 2/2011 | Toumiya et al. | 257/432 |
| 2011/0074013 | A1* | 3/2011 | Ueda et al. | 257/734 |
| 2012/0190211 | A1* | 7/2012 | Ueda et al. | 438/778 |
| 2013/0052836 | A1 | 2/2013 | Hirose et al. | |

FOREIGN PATENT DOCUMENTS

| | | |
|---|---|---|
| JP | 2014-515061 A | 6/2014 |
| WO | 2006/088062 A1 | 8/2006 |
| WO | 2008/035678 A1 | 3/2008 |
| WO | 2011/033987 A1 | 3/2011 |
| WO | 2011/125395 A1 | 10/2011 |
| WO | 2012/142439 A1 | 10/2012 |

* cited by examiner

FILM FORMING METHOD USING PLASMA

CROSS REFERENCE TO RELATED APPLICATION

This application is a 35 U.S.C. 371 National Phase Entry Application from PCT/JP2012/060834, filed Apr. 23, 2012, which claims the benefit of Japanese Patent Application No. 2011-096753, filed Apr. 25, 2011, the disclosures of which are incorporated herein in their entirety by reference.

TECHNICAL FIELD

The present invention relates to a film forming method, in particular, to a film forming method for use in manufacturing a semiconductor device.

BACKGROUND

Conventionally, a thermal chemical vapor deposition (CVD) method has been used when forming insulation layers that require a high voltage withstand characteristic or an excellent leakage characteristic used for, for example, gate oxide films of semiconductor elements represented by, for example, a large scale integrated circuit (LSI), a charge coupled device (CCD) and a metal oxide semiconductor (MOS) transistor. However, when a silicon oxide film requiring a high insulation property is formed using the thermal CVD method as described above, the silicon substrate needs to be exposed to a high temperature. Then, there is a problem in that, when, for example, a conductive layer has been already formed on a silicon substrate by a low melting-point material such as, for example, a low melting-point metal or a high molecular compound, the low melting-point metal may be melted.

From the viewpoint of recent high integration of devices, what is needed is a high quality film that is excellent in coating property or uniformity over steps on, for example, a three dimensional structure and is free of impurities or physical defects in the insulation film or an interface. Atomic layer deposition (ALD) capable of forming a film by supplying a reactant gas repeatedly to a surface of a substrate substantially in atomic unit is known as one of effective means for solving these problems.

A technology of conducting different deposition processes within a single chamber, i.e. one chamber (a processing container) is disclosed in Japanese Patent Laid-Open Publication No. 2007-138295 (Patent Document 1).

PRIOR ART DOCUMENT

Patent Document

Patent Document 1: Japanese Patent Laid-Open Publication No. 2007-138295

DISCLOSURE OF THE INVENTION

Problems to Be Solved

In order to improve characteristics which are demanded of semiconductor devices, it has been recently required to further reduce a film thickness in film forming and improve the uniformity of the film thickness of a formed film. Under this circumstance, carrying out a processing using an atomic layer deposition (ALD) process is effective from the viewpoint of coverage, especially for a complicated shape such as, for example, a shape having a high aspect ratio, i.e. a so-called coating property over steps.

The ALD process will be briefly described below. First, a chemical adsorption gas is supplied into a processing container so that an atomic layer is chemically adsorbed to a surface of a substrate to be processed ("substrate"). In addition, the inside of the processing container is exhausted. Specifically, the surplus gas which has not been chemically adsorbed or the gas which has been physically adsorbed on the chemically adsorbed layer is removed. Then, for example, a nitriding processing or an oxidation processing is carried out on the chemically adsorbed layer so as to modify the chemically adsorbed layer. A series of these processes are repeatedly carried out until a desired film thickness is obtained.

According to such an ALD process, however, throughput may not be improved. That is, in the ALD process, a considerable time is required for filling the processing container with the chemical adsorption gas at every cycle. In addition, time is also required for setting the inside of the processing container to an optimized pressure or temperature required for, for example, a nitriding processing, at every cycle.

An object of the present disclosure is to provide a film forming method which is capable of improving throughput and forming a high quality film.

Means for Solving the Problems

A film forming method according to the present disclosure is a method of forming a film on a substrate. The film forming method includes: supplying a first raw material gas over the substrate so that a first chemical adsorption layer that is adsorbed on the substrate by means of the first raw material gas is formed on the substrate; supplying a second raw material that is different from the first raw material gas over the substrate on which the first chemical adsorption layer is formed so that a second chemical adsorption layer that is adsorbed by means of the second raw material gas is formed on the first chemical adsorption layer; and carrying out a plasma processing on at least the first and second chemical adsorption layers using microwave plasma.

According to such a film forming method, since the plasma processing is carried out on the first and second chemical adsorption layers that are adsorbed and formed by means of the first and second raw material gases by supplying the first and second raw material gases, the number of times of plasma processing may be reduced in forming a film having a desired film thickness. As a result, throughput may be improved. Further, since the plasma processing is carried out on at least the first and second chemical adsorption layers to obtain a film having a desired thickness, the probability of damaging an underlayer of a chemical adsorption layer by the plasma may be reduced. Accordingly, a good quality film may be formed.

The film forming method may further include exhausting the first raw material gas after the supplying the first raw material gas and prior to the supplying the second raw material gas.

The film forming method may include exhausting the second raw material gas after the supplying the second raw material gas.

The supplying the first raw material gas may include supplying a gas that contains a halogenide.

The supplying the second raw material gas may include supplying a gas having hydrogen bonds.

In an exemplary embodiment, the supplying the first raw material gas supplies a gas that contains $Si_2Cl_6$ (hexachlorodisilane) and the supplying the second raw material gas includes supplying a gas that contains $SiH_4$ (silane).

The microwave plasma may be generated by a radial line slot antenna.

The plasma processing may use microwave plasma that has an electron temperature lower than 1.5 eV and an electron density higher than $1 \times 10^{11}$ cm$^{-3}$ in the vicinity of a surface of the substrate.

In addition, the film forming method is a method of forming a nitride film or an oxide film.

Effect of the Invention

According to such a film forming method as described above, since the plasma processing is carried out at least on the first and second chemical adsorption layers that are adsorbed and formed by means of the first and second raw material gases by supplying the first and second raw material gases, the number of times of plasma processing may be reduced in forming a film having a desired film thickness. As a result, throughput may be improved. Further, since the plasma processing is carried out at least on the first and second chemical adsorption layers to obtain a film having a desired thickness, the probability of damaging an underlayer of a chemical adsorption layer by the plasma may be reduced. Accordingly, a good quality film may be formed as a whole.

DETAILED DESCRIPTION FOR EXECUTING THE INVENTION

Figure 1:
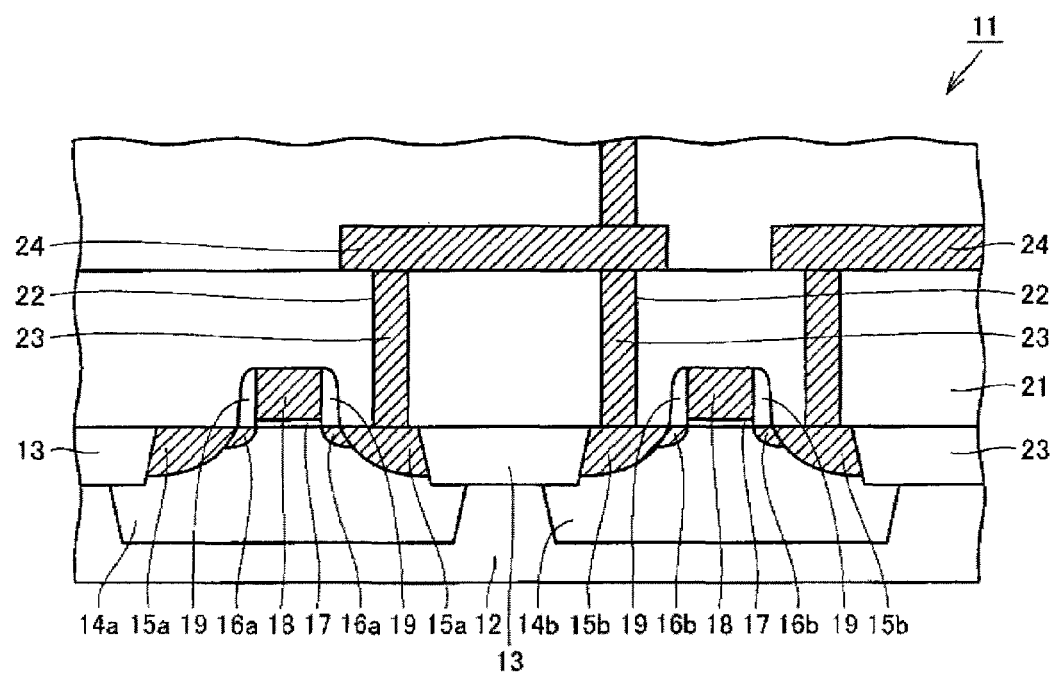
FIG. 1 is a schematic cross-sectional view illustrating a portion of a MOS type semiconductor device.

Hereinafter, exemplary embodiments of the present disclosure will be described with reference to accompanying drawings. First, a configuration of a semiconductor device having films formed by a film forming method according to an exemplary embodiment of the present disclosure will be described. FIG. 1 is a schematic cross-sectional view illustrating a portion of a MOS type semiconductor device. In the MOS type semiconductor device illustrated in FIG. 1, conductive layers are indicated by hatching.

Referring to FIG. 1, the MOS type semiconductor device 11 is formed with an element isolation region 13, a p-type well 14a, an n-type well 14b, a high density n-type impurity diffusion region 15a, a high density p-type impurity diffusion region 15b, an n-type impurity diffusion region 16a, a p-type impurity diffusion region 16b, and a gate oxide film 17, on a silicon substrate 12. The high density n-type impurity diffusion region 15a and the high density p-type impurity diffusion region 15b are formed in such a manner that the gate oxide film 17 is interposed therebetween and one of the diffusion regions 15a and 15b becomes a drain and the other becomes a source.

In addition, gate electrodes 18 that become a conductive layer are formed on the top of the gate oxide film 17 and gate side walls 19 that become an insulation film are formed at the sides of the gate electrodes 18. In addition, an insulation film 21 is formed on the silicon substrate 12 on which for example, the gate electrodes 18 are formed as described above. The insulation film 21 is formed with contact holes 22 which are connected to the high density n-type impurity diffusion region 15a and the high density p-type impurity diffusion region 15b, and a hole filling electrode 23 is formed in each of the contact holes 22. In addition, a metal wiring layer 24 which becomes a conductive layer is formed over the contact holes 22. Further, an inter-layer insulation film which becomes an insulation layer and a metal wiring layer which becomes a conductive layer are alternately formed and finally, pads (not illustrated) which become contacts to the outside are formed. In this manner, the MOS type semiconductor 11 is formed.

As described below, a semiconductor element with a film formed by the film forming method according to an exemplary embodiment of the present disclosure includes a silicon oxide film as, for example, a gate oxide film 17. The silicon oxide film is formed by forming dual chemical adsorption layers by causing first and second raw material gases to be adsorbed on a substrate and carrying out a plasma processing on the dual chemical adsorption layers by causing the first and second raw material gases to be adsorbed. In addition, an insulation film formed by the film forming method according to an exemplary embodiment of the present disclosure is a silicon oxide film that forms the gate oxide film as described above. The insulation film by a film forming method according to an exemplary embodiment of the present disclosure is a silicon oxide film that forms the gate oxide film. The insulation film is formed by forming dual chemical adsorption layers on a substrate by causing first and second raw material gases adsorbed on the substrate, and carrying out a plasma processing on the dual chemical adsorption layers formed by causing the first and second raw material gases to be adsorbed on the substrate.

Next, a configuration and an operation of a plasma processing apparatus to be used for a film forming method according to an exemplary embodiment of the present disclosure will be described.

Figure 2:
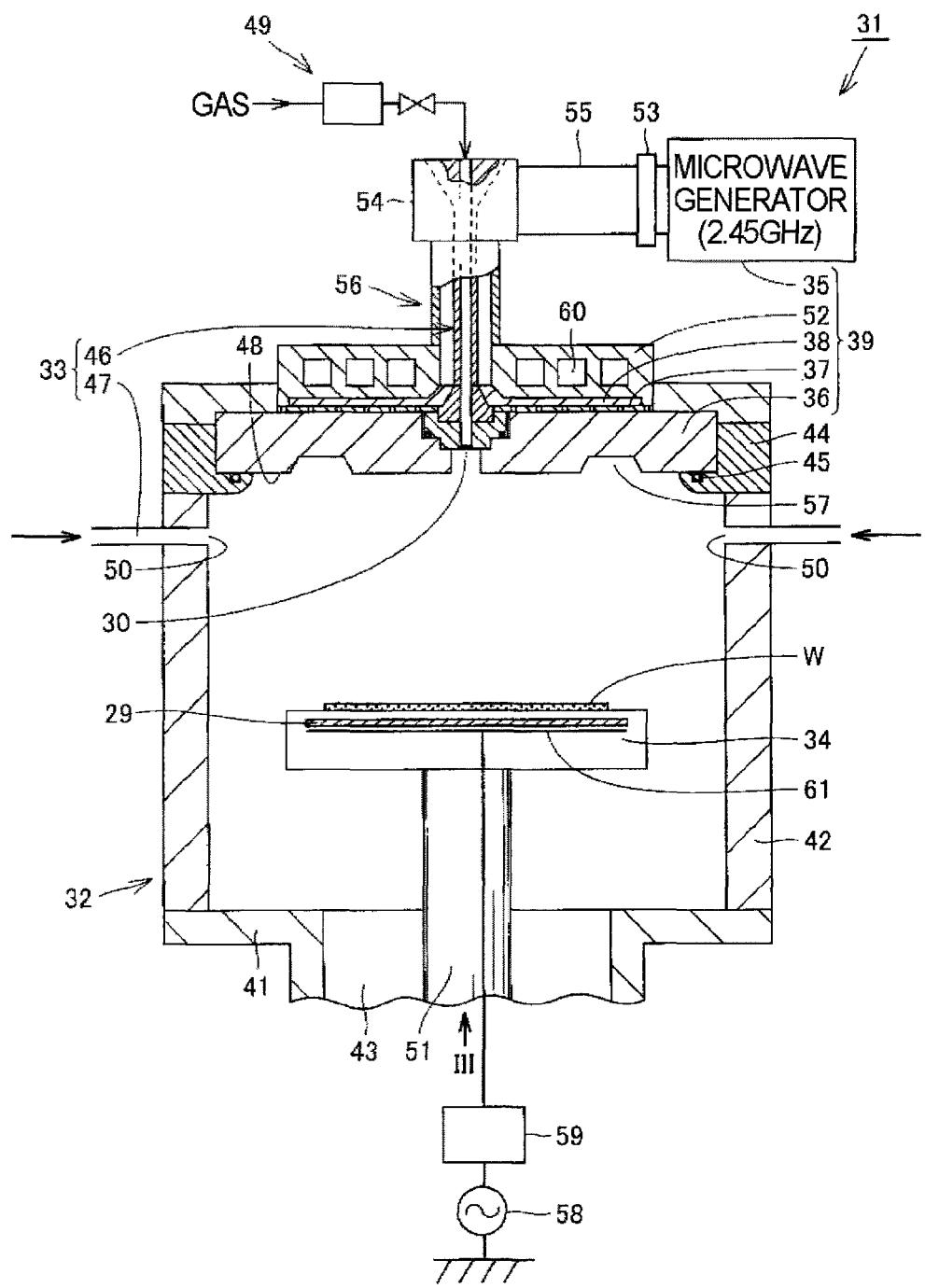
FIG. 2 is a schematic cross-sectional view illustrating a principal portion of a plasma processing apparatus which is used for a film forming method according to an exemplary embodiment of the present disclosure.
Figure 3:
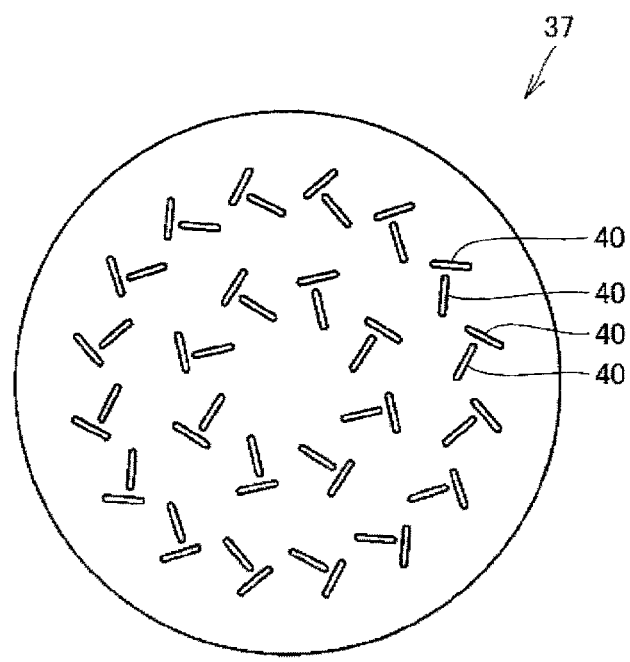
FIG. 3 is a view illustrating a slot antenna plate included in the plasma processing apparatus illustrated in FIG. 2, when viewed in a film thickness direction.

FIG. 2 is a schematic cross-sectional view illustrating a principal portion of a plasma processing apparatus that is used for a film forming method according to an exemplary embodiment of the present disclosure. In addition, FIG. 3 is a view illustrating a slot antenna plate included in the plasma processing apparatus illustrated in FIG. 2, when viewed in a film thickness direction, that is, the direction indicated by arrow III. For the purpose of easy understanding, hatching is omitted for some elements.

Referring to FIGS. 2 and 3, the plasma processing apparatus 31 includes: a processing container 32 in which a plasma processing is carried out on a substrate W, a gas supply unit 33 configured to supply a plasma excitation gas or a plasma processing gas into the processing container 32, a gas supply unit 33 configured to supply, for example, a raw material gas in ALD, a disc-shaped support unit 34 configured to support the substrate W thereon, a plasma generating mechanism 39 configured to generate plasma within the processing container 32 using a microwave, and a control unit (not illustrated) configured to control the entire operation of the plasma processing apparatus 31. The control unit controls the processing apparatus 31 in its entirety such as for example, a gas flow rate from the gas supply unit 33 and a pressure within the processing container 32.

The processing container 32 includes a bottom portion 41 positioned below the support unit 34, and a side wall 42 extending upward from the circumference of the bottom portion 41. The side wall 42 has a substantially cylindrical shape. An exhaust opening 43 is formed through a part of the bottom portion 41 of the processing container 32. The top side of the processing container 32 is opened and the processing container 32 is configured to be sealed by a cover unit 44 disposed at the top side of the processing container 32 and a dielectric window 36 to be described later, and an O-ring 45 as a seal member interposed between the dielectric window 36 and the cover unit 44.

The gas supply unit 33 includes a first gas supply section 46 configured to blow a gas toward the center of the substrate W and a second gas supply section 47 configured to blow a gas from a peripheral side of the substrate W. A gas supply hole 30 that supplies gas in the first gas supply section 46 is formed at a position which is located at the center of the dielectric window 36 in the radial direction and retreated to the inside of the dielectric window 36 as compared with the bottom surface 48 of the dielectric window 36 which is a surface facing the support unit 34. The first gas supply section 46 supplies, for example, a plasma excitation inert gas, a plasma processing material gas, or an ALD raw material gas while controlling, for example, a flow rate by a gas supply system 49 connected to the first gas supply section 46. The second gas supply section 47 is formed by forming a plurality of gas supply holes 50 at a portion of the upper side of the side wall 42 to supply, for example, a plasma excitation inert gas, a plasma excitation material gas or a raw material gas into the processing container 32. The plurality of gas supply holes 50 are formed at equidistant intervals in the circumferential direction. The first gas supply section 46 and the second gas supply section 47 are supplied with the same kinds of, for example, plasma excitation gases and raw material gases from the same gas supply sources. Further, according to a request or control contents, separate gases may be supplied from the first gas supply section 46 and second gas supply section 47 and, for example, the flow rates of the gases may be adjusted.

In the support unit 34, a high frequency power supply 58 for radio frequency (RF) bias is electrically connected to an electrode 61 within the support unit 34 through a matching unit 59. The high frequency power supply 58 may output RF of, for example, 13.56 MHz using a predetermined power (bias power). The matching unit 59 accommodates a matcher configured to match the impedance of the high frequency power supply 58 side and the impedance of a load side for which the electrode 61, plasma and the processing container 32 may be mainly referred to, and a blocking condenser configured to protect the matcher is included in the matcher.

The support unit 34 may support the substrate W thereon by an electrostatic chuck (not illustrated). Further, the support unit 34 is provided with, for example, a temperature control mechanism and may set a desired temperature using a heater 29 installed within the support unit 34. The support unit 34 is supported on an insulative cylindrical support 51 extending vertically upward from the bottom side of the bottom portion 41. The exhaust opening 43 is formed through a portion of the bottom portion 41 of the processing container 32 along the circumference of the cylindrical support 51. An exhaust chamber (not illustrated) protruding downward to surround the exhaust opening 43 is provided and an exhaust apparatus (not illustrated) is connected to the exhaust chamber though a exhaust pipe (not illustrated) connected to the exhaust chamber. The exhaust apparatus includes a vacuum pump such as, for example, a turbo molecular pump. The inside of the processing container 32 may be decompressed to a predetermined pressure by the exhaust apparatus.

The plasma generating mechanism 39 is provided at the upper side and outside of the processing container 32. The plasma generating mechanism 39 includes: a microwave generator 35 configured to generate microwave for plasma excitation; a dielectric window 36 positioned to be opposite to the support unit 34 and configured to introduce the microwave generated by the microwave generator 35 into the processing container 32; a slot antenna plate 37 formed with a plurality of slots 40 (see, e.g., FIG. 3) and disposed on the top side of the dielectric window 36, the slot antenna being configured to irradiate microwave to the dielectric window 36; and a dielectric member 38 disposed on the top side of the slot antenna plate slot antenna plate 37 to radially propagate microwave introduced by a coaxial waveguide 56.

The microwave generator 35 includes a matching mechanism 53 and is connected to the upper portion of the coaxial waveguide 56 configured to introduce a microwave through the waveguide 55 and a mode converter 54. For example, a TE-mode microwave generated using the microwave generator 35 passes through the waveguide 55 and is converted into a TEM mode by the mode converter 54. The TEM-mode microwave propagates through the coaxial waveguide 56. As for the frequency of the microwave generated by the microwave generator 35, for example, 2.45 GHz is selected.

The dielectric window 36 has a substantially disc shape and is made of a dielectric material. At a portion of the bottom surface 48 of the dielectric window 36, an annular recess 57 recessed in a taper shape is formed so as to facilitate the generation of a standing wave by the introduced microwave. By virtue of the recess 57, plasma by a microwave may be efficiently generated underside of the dielectric window 36. Further, as for a specific material of the dielectric window 36, for example, quartz or alumina may be used.

The slot antenna plate 37 is made of a metal in a thin disc shape. As illustrated in FIG. 3, a plurality of elongated hole-shaped slots 40 are formed in the slot antenna plate 37 such that slots 40 of each pair cross substantially at right angles and the plural pairs of slots 40 are concentrically formed at a predetermined interval in the circumferential direction. The plural pairs of slots 40 are also concentrically formed in the radial direction.

A microwave generated by the microwave generator 35 is propagated to the dielectric member 38 through the coaxial waveguide 56. The microwave spreads out radially to the outside in the inside of the dielectric member 38 sandwiched between a cooling jacket 52 and the slot antenna plate 37, penetrates the dielectric window 36 form the plural slots 40 formed in the slot antenna plate 37, and enters into the processing container 32. The cooling jacket 52 includes a circulation path 60 configured to circulate, for example, a refrigerant in the inside thereof and is configured to control the temperatures of, for example, the slot antenna plate 37, dielectric window 36, and the dielectric member 38. The microwave produces an electric field just below the dielectric window 36 and generates plasma within the processing container 32. That is, the microwave plasma provided for the processing in the plasma processing apparatus 31 is generated within the processing container 32 by the microwave irradiated from the radial line slot antenna that includes the cooling jacket 52, the slot antenna plate 37 and the dielectric member 38 which are configured as described above. In the following description, the plasma generated as described above may be referred to as radial line slot antenna plasma.

Figure 4:
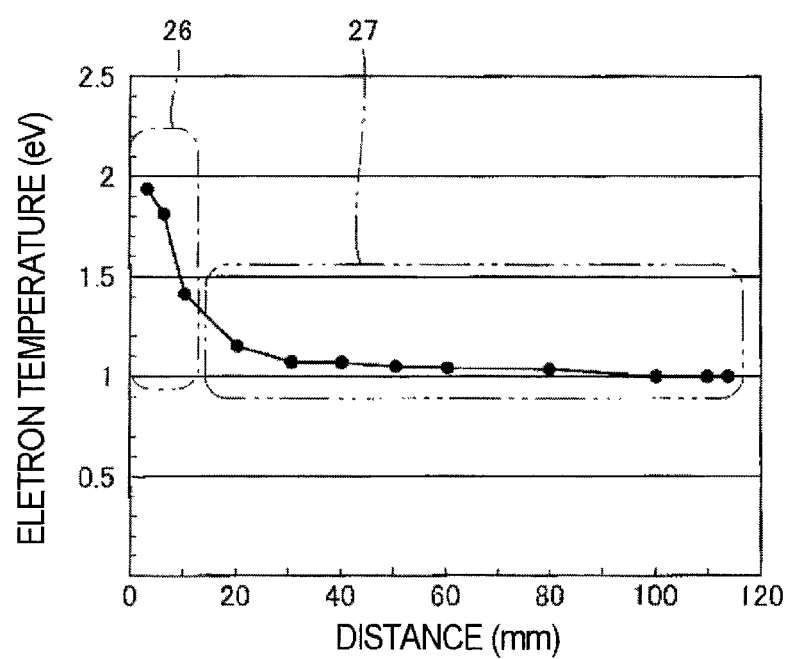
FIG. 4 is a graph illustrating a relationship between a distance from the bottom surface of a dielectric window and an electron temperature.
Figure 5:
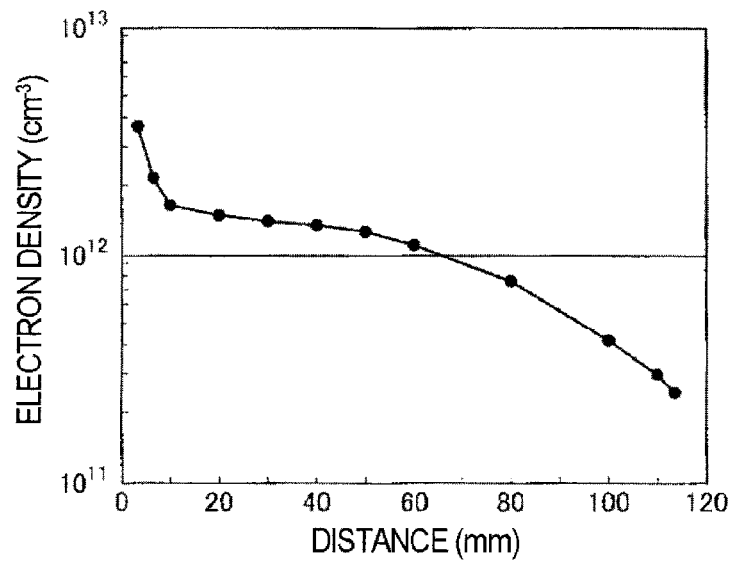
FIG. 5 is a graph illustrating a relationship between a distance from the bottom surface of the dielectric window and an electron density of plasma.

FIG. 4 is a graph representing a relationship between a distance from the bottom surface 48 of the dielectric window 36 within the processing container 32 and an electron temperature of plasma when the plasma is generated in the plasma processing apparatus 31. FIG. 5 is a graph is a graph representing a relationship between a distance from the bottom surface 48 of the dielectric window 36 within the processing container 32 and an electron density of plasma when the plasma is generated in the plasma processing apparatus 31.

Referring to FIGS. 4 and 5, a region just below the dielectric window 36, specifically, the region 26 of about 10 mm illustrated by indicated by an alternate long and short dash line in FIG. 4 is referred to as a so-called plasma generating region. In this region 26, the electron temperature is high and the electron density is higher than $1 \times 10^{12}$ cm$^{-3}$. Meanwhile, the region 27 exceeding 10 mm and indicated by an alternate long and two dashes line is referred to as a diffusion region. In the region 27, the electron temperature is about 1.0 eV to about 1.3 eV and the electron density is about $1 \times 10^{12}$ cm$^{-3}$ and higher than at least $1 \times 10^{11}$ cm$^{-3}$. A plasma processing for a substrate W to be described below is carried out in such a plasma diffusion region, for example. That is, in the plasma processing, it is desirable to use microwave plasma that has an electron temperature lower than 1.5 eV and an electron density higher than $1 \times 10^{11}$ cm$^{-3}$ in the vicinity of a surface of the substrate W.

Figure 6:
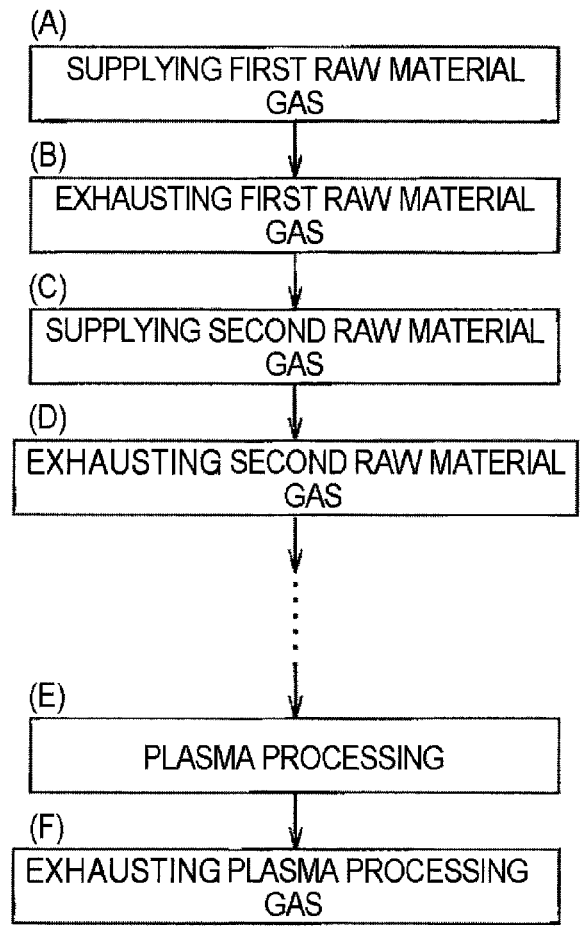
FIG. 6 is a flowchart illustrating representative steps in a film forming method according to an exemplary embodiment of the present disclosure.

Next, a film forming method according to an exemplary embodiment will be described. FIG. 6 is a flowchart illustrating representative steps in the film forming method according to an exemplary embodiment of the present disclosure. As for the temperature of the support unit 34 during the plasma processing to be described later, an arbitrary temperature, for example, between 300° C. to 400° C., may be selected. In addition, it is assumed that a silicon nitride film (SiN film) is formed here.

Typically, when, for example, a natural oxide film or an organic matter is adhered to a surface of a substrate W, a chemical adsorption layer of a raw material gas may not be formed on the substrate W even if a raw material gas of a gas containing, for example, Si$_2$Cl$_6$ (hexachlorodisilane) ("HCD") is supplied to the substrate W. In such a case, the surface of the substrate W may be terminated by hydrogen by generating hydrogen plasma in the processing container 32. Such a problem may deteriorate uniformity and quality of the film to be fabricated. Accordingly, when the pre-processing processes are carried out as described above, the surface condition of the substrate W may be improved. The pre-processing processes may be properly changed according to the kind of the substrate W, the kind of the film to be formed, and the required film quality. For example, when the substrate W is a Si substrate, a nitriding processing may be directly carried out on the substrate W using plasma without carrying out chemical adsorption, or ultraviolet rays may be irradiated on the substrate W to remove an organic matter. Since the pre-processing processes are optional processes that are carried out as needed and may be omitted.

Next, the substrate W is supported on the support unit 34 using an electrostatic chuck. Then, a first raw material gas containing a chlorine-based gas, for example, Si$_2$Cl$_6$ (HCD) is supplied to the surface of the substrate W from the gas supply sections 46, 47 to form a first chemical adsorption layer that is adsorbed by the first raw material gas [step (A) in FIG. 6]. Then, since the surface of the substrate W is hydrogen-terminated when the above-described pre-processings have been carried out, H (hydrogen) on the surface of the substrate W and Cl (chlorine) of Si$_2$Cl$_6$ (HCD) are reacted, forming HCl that leaves the surface of the substrate W. In addition, SiCl$_3$ is chemically adsorbed to the surface of the substrate W, thereby forming the first chemical adsorption layer. In such a case, the surface of the substrate W is terminated by chlorine.

Next, the first raw material gas unnecessarily remaining within the processing container 32 is exhausted [step (B) of FIG. 6]. When exhausting the first raw material gas within the processing container 32, the gas within the processing gas 43 may be removed from the exhaust opening 43 while supplying an exhaust purge gas from the gas supply sections 46, 47. As for the purge gas, for example, argon (Ar) gas may be used. Through the step of exhausting the first raw material gas, the first raw material gas physically adsorbed on the chemical adsorption layer or the first raw material gas superfluously existing within the processing container 32 may be efficiently and rapidly removed from the inside of the processing container 32.

Next, a second raw material gas that is different from the first raw material gas, for example, SiH$_4$ (silane) gas having hydrogen bonds, is supplied from the gas supply sections 46, 47 so that a second chemical layer which is adsorbed by means of the second raw material gas is formed on the first chemical adsorption layer [step (C) of FIG. 6]. In this case, Cl (chlorine) on the surface of the substrate W and H of SiH$_4$ as the second raw material gas are reacted with each other, forming HCl that leaves the surface of the substrate W. In addition, a Si compound (SiH$_x$ such as SiH, SiH$_2$ or SiH$_3$) is chemically adsorbed on the surface of the substrate W, forming a second chemical adsorption layer. In this case, the surface of the substrate W is terminated by hydrogen.

Next, the second raw material gas is exhausted from the inside of the processing container 32 [step (D) of FIG. 6]. When exhausting the second raw material gas within the processing container 3, like the exhaust of the first raw material gas as described above, the gas within the processing container 32 may be removed from the exhaust opening 43 while supplying an exhaust purge gas from the gas supply sections 46, 47.

In this manner, the formation of the first chemical adsorption layer by the supply of the first raw material gas and the formation of the second chemical adsorption layer by the supply of the second raw material gas are carried out. In addition, when steps (A) to (D) in FIG. 6, i.e. the formation of the chemical adsorption layer of the first raw material gas and the formation of the chemical adsorption layer of the second raw material gases are alternately carried out plural times, a film thickness desired for carrying out the plasma processing may be formed. For example, a film thickness of 0.2 nm to 20 nm is preferable.

Next, after the desired film thickness is formed by alternately carrying out the formation of the first chemical adsorption layer and the formation of the second chemical adsorption layer plural times, a plasma process is carried out on the first and second chemical adsorption layers by the plasma of a nitrogen containing gas [step (E) of FIG. 6]. In this case, a plasma nitriding processing is carried out using the microwave plasma generated by the plasma processing apparatus 31 as described above. Specifically, a plasma processing gas, for example, argon (Ar) gas as a plasma excitation gas and ammonia ($NH_3$) as the nitrogen containing gas are supplied from the gas supply sections 46, 47 to form plasma of the nitrogen containing gas so that the plasma nitriding processing of the first and second chemical adsorption layers is carried out by the plasma of the nitrogen containing gas.

In addition, when forming an oxide film, a plasma oxidizing processing is carried out using a mixture gas of argon (Ar) gas as the plasma excitation gas and oxygen ($O_2$) gas.

After the plasma processing, the plasma processing gas is exhausted [step (F) of FIG. 6]. Then, the steps (A) to (F) of FIG. 6 are repeated again to obtain a nitride film of a desired film thickness.

With the above-described configuration, since the plasma processing is carried out on the first and second chemical adsorption layers by supplying the first and second raw material gases, the times of plasma processings may be reduced in forming a film having a desired film thickness, thereby improving throughput. In addition, the concerns of damaging an underlayer of a chemical adsorption layer may be reduced. Accordingly, a high quality film may be formed.

In this case, since ALD may be carried out at a relatively low temperature without needing to perform a processing carried out at a temperature of 600° C. or higher like thermal ALD, a high quality film may be formed at a low temperature. As a result, a manufacturing process may be freely carried out, for example, in manufacturing semiconductor devices using a low melting-point metal.

There is a case in which a gas containing, for example, BTBAS (bis-tertiaryl-buthyl-amino-silane) is used as an ALD gas. However, a gas that contains molecules having a relatively high molecular mass like BTBAS is usually expensive and more expensive than at least the above-described gases that contain hexachlorodisilane or silane having a relatively low molecular mass. Accordingly, using such an expensive gas in quantity for film forming is unfavorable in terms of costs. Especially, a relatively large amount of a raw material gas supplied into the processing container becomes superfluous without being chemically adsorbed and is finally exhausted. In this respect, using a gas that contains hexachlorodisilane or a gas that contains silane as described above is advantageous in terms of cost saving.

In this case, microwave plasma is generated by a radial line slot antenna. Then, plasma damage during film forming may be considerably reduced. Accordingly, with this film forming method, a high quality film may be formed. That is, since the plasma generated by microwave discharged from the radial line slot antenna is used, the processing is carried out in the generated plasma at a relatively low electron temperature. In addition, since radicals are mainly generated, the nitriding processing is carried out using the radicals. Then, when forming a nitride film, charging damage to the underlayer or physical damage caused by, for example, ion irradiation may be substantially reduced. Accordingly, a high quality film may be formed.

In addition, as for the first raw material gas, a gas such as, for example, $SiCl_4$, $Si_3Cl_8$ or $SiH_2Cl_2$, may be used as a chlorine-based gas, except $Si_2Cl_6$ as described above. In addition, a gas that contains aluminum chloride or a gas that contains $Ge_2Cl_6$ is used. As for the second raw material gas, specifically, a gas that contains $Si_2H_4$, $Si_3H_8$, $SiH_2Cl_2$, trimethyl aluminum (TMAl) except $SiH_4$ as described above or a gas that contains $GeH_4$ may be used as the hydrogen-based gas. Further, as for the second raw material gas, a gas having an amino group or a gas having an alkyl group such as, for example, a methyl group or an ethyl group, may be used. Examples of specific combination include a pattern in which a gas that contains aluminum chloride is used as for the first raw material gas and a gas that contains trimethyl aluminum is used as for the second raw material gas, and a pattern in which a gas that contains $Ge_2Cl_6$ is used as for the first raw material gas and a gas that contains $GeH_4$ is used as for the second raw material gas. In addition, films to be formed include a nitride film and an oxide film. Specifically, the films to be formed include a silicon oxide film, a silicon nitride film, an aluminum oxide film, an aluminum nitride film, a gallium oxide film, a gallium nitride film, a hafnium oxide film, a hafnium nitride film, a ruthenium oxide film, and a ruthenium nitride film, for example.

Figure 7:
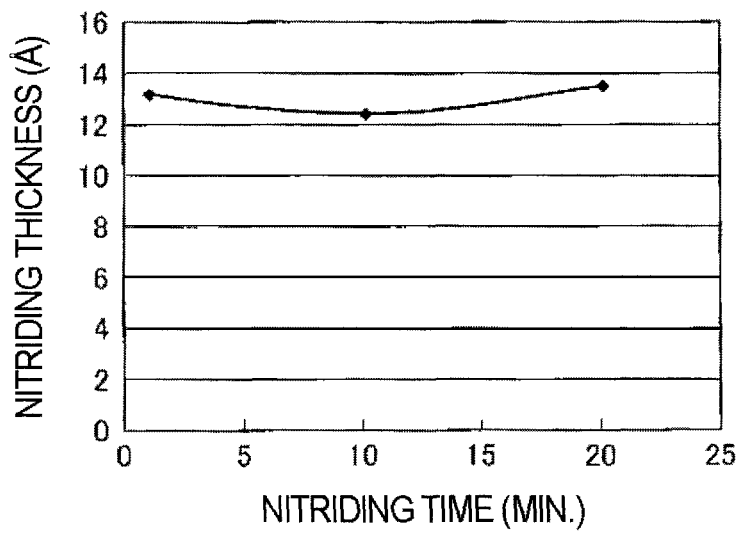
FIG. 7 is a graph illustrating a relationship between a thickness of a nitride film and a nitriding time.

Now, a relationship between a thickness and a nitriding time of a nitride film will be described. FIG. 7 is a graph illustrating a relationship between a thickness and a nitriding time of a nitride film. In FIG. 7, the vertical axis represents a thickness of the nitride film [Å (angstrom)] and the horizontal axis represents a nitriding time (minute).

Referring to FIG. 7, when the nitriding time is about 1 minute, about 10 minutes, or 20 minutes, the thickness of the nitride film, i.e. the film thickness that is capable of being nitrided by a plasma processing is in the range of 12 Å to 14 Å. That is, in nitriding using a plasma processing, the factor due to time is little and the nitriding processing may be carried out within a short time by setting the film thickness of a chemical adsorption layer to the range as described above. In the above-described process, considering an influence on the substrate W, the plasma nitriding processing may be carried out after a chemical adsorption layer of about 12 Å to about 14 Å is formed at the initial stage of the film forming process. As such, the probability of nitriding the underlayer of the chemical adsorption layer may be reduced. In the subsequent processes, a nitride film of a desired film thickness may be obtained by repeating a cycle in which, after a chemical adsorption layer of not more than 12 Å is formed, a plasma nitriding processing is carried out so as to ensure the nitriding of the chemical adsorption layer. Consequently, a high quality film may be efficiently obtained.

Figure 8:
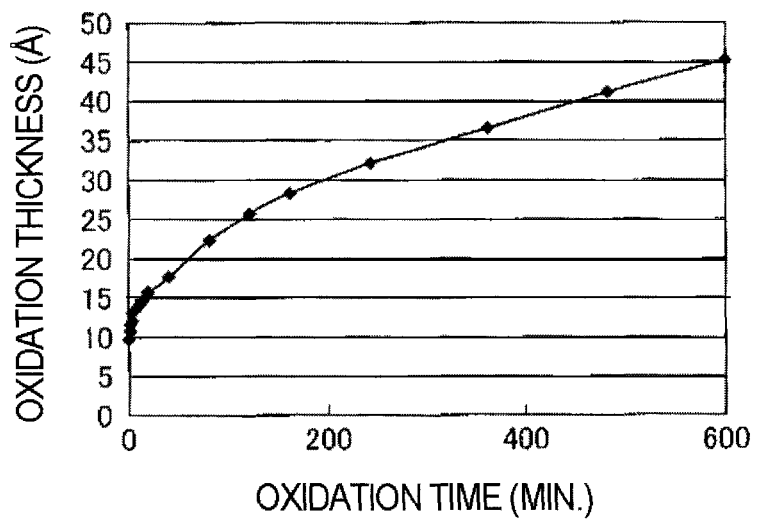
FIG. 8 is a graph illustrating a relationship between a thickness of an oxide film and an oxidation time.

Next, descriptions will be made on a relationship between a film thickness and an oxidation time of an oxide film. FIG. 8 is a graph illustrating a relationship between a film thickness and oxidation time of an oxide film. In FIG. 8, the vertical axis represents the oxide film thickness [Å (angstrom)] and the horizontal axis represents the oxide time (sec).

Referring to FIG. 8, it may be understood that as the oxidation time increases, the oxide film thickness also increases. That is, in the plasma oxidation, when the chemical adsorption layer is formed to an arbitrary thickness and then a plasma oxidation processing is carried out by a time depending on the thickness, film forming may be properly carried out. When comparing with that in the plasma nitriding, the time efficiency in the plasma oxidation is about a tenth part.

In addition, as to the process conditions in film forming, the temperature in the adsorption process may be a temperature in the range which is not lower than normal temperature and lower than 600° C. and preferably in the range of 200° C. to 400° C. Further, in forming a film, a pressure in the range of 0.1 Torr to 10 Torr is mainly employed. When forming a nitride film, a pressure in the range of 3 Torr to 8 Torr is mainly employed and when forming an oxide film, a pressure in the range of 50 mTorr to 500 mTorr is mainly employed.

Here, with reference to Table 1 below, specific processes in forming a nitride film will be described. Table 1 represents some of specific processes in forming a nitride film.

TABLE 1

| Step | Process | Gas flow rate (sccm) | | | | | Pressure (Torr) | Microwave Power (W) | Surface status |
|---|---|---|---|---|---|---|---|---|---|
| | | Cl-based gas (HCD) | H-based gas (SiH$_4$) | NH$_3$ | N$_2$ | Ar | | | |
| 1 | Initial nitriding | — | — | 400 | 900 | 1200 | 5 | 4000 | H termination |
| 2 | Cl-based gas adsorption | 100 | — | — | — | 1000 | 1 | — | Cl termination |
| 3 | Exhaust | — | — | — | — | — | — | — | Cl termination |
| 4 | H-based gas adsorption | — | 100 | — | — | 1000 | 1 | — | H termination |
| 5 | Exhaust | 100 | — | — | — | — | — | — | H termination |
| 6 | Cl-based gas adsorption | — | — | — | — | 1000 | 1 | — | Cl termination |
| 7 | Exhaust | — | — | — | — | — | — | — | Cl termination |
| 8 | H-based gas adsorption | — | 100 | — | — | 1000 | 1 | — | H termination |
| 9 | Exhaust | — | — | — | — | — | — | — | H termination |
| 10 | Cl-based gas adsorption | 100 | — | — | — | 1000 | 1 | — | Cl termination |
| 11 | Exhaust | — | — | — | — | — | — | — | Cl termination |
| 12 | H-based gas adsorption | — | 100 | — | — | 1000 | 1 | — | H termination |
| 13 | Exhaust | | | | | | | | H termination |
| 14 | Nitriding | — | — | 400 | 900 | 1200 | 5 | 4000 | H termination |
| 15 | Cl-based gas adsorption | 100 | — | — | — | 1000 | 1 | — | Cl termination |
| 16 | Exhaust | | | | | | | — | Cl termination |
| 17 | H-based gas adsorption | — | 100 | — | — | 1000 | 1 | — | H termination |
| 18 | Exhaust | — | — | — | — | — | — | — | H termination |
| 19 | Cl-based gas adsorption | 100 | — | — | — | 1000 | 1 | — | Cl termination |
| 20 | Exhaust | — | — | — | — | — | — | — | Cl termination |
| 21 | H-based gas adsorption | — | 100 | — | — | 1000 | 1 | — | H termination |
| 22 | Exhaust | — | — | — | — | — | — | — | H termination |
| 23 | Cl-based gas adsorption | 100 | — | — | — | 1000 | 1 | — | Cl termination |
| 24 | Exhaust | — | — | — | — | — | — | — | Cl termination |
| 25 | H-based gas adsorption | — | 100 | — | — | 1000 | 1 | — | H termination |
| 26 | Exhaust | — | — | — | — | — | — | — | H termination |
| 27 | Nitriding | — | — | 400 | 900 | 1200 | 5 | 4000 | H termination |

Table 1 represents processes, flow rates of supplied gases, pressures, microwave powers, and corresponding surface states of a substrate in this order from the left column. The processes are progressed from the top row toward the bottom row. In Table 1, "-" represents conditions in which no gas is flown, no pressure is controlled or no microwave power is supplied.

First, in the initial nitriding process (step 1), plasma nitriding is carried out on the substrate surface. In this case, $NH_3$ is supplied at a flow rate of 400 sccm, $N_2$ gas is supplied at a flow rate of 900 sccm, and Ar gas is supplied at a flow rate of 1200 sccm. The pressure is 5 Torr and the microwave power is 4000 W. In this case, the surface status of the substrate becomes H termination. In addition, when the substrate surface is in a state in which formation of an adsorption layer by supplying a material gas is enabled, the initial nitriding process (step 1) may be omitted. When a natural oxide film or organic matter is adhered to the substrate surface, it is desired to perform a hydrogen plasma processing to be hydrogen terminated.

Next, in a Cl-based gas adsorption process (step 2: first chemical adsorption layer forming process), a Cl-based gas (first raw material gas) is supplied to form a first chemical adsorption layer on the surface of the substrate. In this case, Ar gas is supplied at a flow rate of 1000 sccm, HCD gas as the Cl-based gas is supplied at a flow rate of 100 sccm, and the pressure is set to 1 Torr. Thereafter, the unnecessarily remaining raw material gas is exhausted (step 3). In steps 2 and 3, the surface status of the substrate becomes Cl termination.

Then, in a H-based gas adsorption process (step 4: second chemical adsorption layer forming process), a H-based gas (second raw material gas) is supplied to form a second chemical adsorption layer on the first chemical adsorption layer as described above. In this case, Ar gas is supplied at a flow rate of 1000 sccm, $SiH_4$ gas as the H-based gas is supplied at a flow rate of 100 sccm, and the pressure is set to 1 Torr. Thereafter, the unnecessary remaining raw material gas is exhausted (step 5). In steps 4 and 5, the surface status of the substrate becomes H termination.

Next, in a Cl-based gas adsorption process (step 6), the Cl-based gas is supplied again to form the first chemical adsorption layer. In this case, as in step 2, Ar gas is supplied at a flow rate of 1000 sccm, HCD gas as the Cl-based gas is supplied at a flow rate of 100 sccm, and the pressure is set to 1 Torr. Thereafter, the unnecessarily remaining raw material gas is exhausted (step 7). In steps 6 and 7, the surface state of the substrate becomes Cl termination again.

Then, in a H-based gas adsorption process (step 8), H-based gas is supplied again to form the second chemical adsorption layer. In this case, as in step 4, Ar gas is supplied at a flow rate of 1000 sccm, $SiH_4$ gas as the H-based gas is supplied at a flow rate of 100 sccm, and the pressure is set to 1 Torr. Thereafter, the unnecessarily remaining raw material gas is exhausted (step 9). In steps 8 and 9, the surface state of the substrate becomes H termination again.

Next, in a Cl-based gas adsorption process (step 10), Cl-based gas is supplied again to form the first chemical adsorption layer. In this case, as in steps 2 and 6, Ar gas is supplied at a flow rate of 1000 sccm, HCD gas as the Cl-based gas is supplied at a flow rate of 100 sccm, and the pressure is set to 1 Torr. Thereafter, the unnecessarily remaining raw material gas is exhausted (step 11). In steps 10 and 11, the surface state of the substrate becomes Cl termination again.

Then, in a H-based gas adsorption process (step 12), H-based gas is supplied again to form the second chemical adsorption layer. In this case, as in steps 4 and 8, Ar gas is supplied at a flow rate of 1000 sccm, $SiH_4$ gas as the H-based gas is supplied at a flow rate of 100 sccm, and the pressure is set to 1 Torr. Thereafter, the unnecessarily remaining raw material gas is exhausted (step 13). In steps 12 and 13, the surface state of the substrate becomes H termination again.

As described, adsorption by the Cl-based gas and adsorption by the H-based gas are alternately carried out three times while providing an exhaust process between respective processes in the gas adsorption processes. In this exemplary embodiment, three first chemical adsorption layers by the supply of Cl-based gas and three second chemical adsorption layers by the supply of H-based gas are alternately formed so that a first chemical adsorption layer that corresponds to six atomic layers is adsorbed.

A nitriding processing of the atoms adsorbed in six atomic layers by plasma is carried out (step 14). In the nitriding process, $NH_3$ gas is flown at a flow rate of 400 sccm, $N_2$ gas is flown at a flow rate of 900 sccm, Ar gas is flown at a flow rate of 1200 sccm, the pressure is set to 5 Torr, and the microwave power is set to 4000 W. In this manner, the plasma nitriding processing of the atomic layers adsorbed by six atomic layers (formation of a first nitride film) is carried out. In addition, in this case, the surface status of the substrate becomes H termination. Further, the flow of steps 2 to 14 is set as one cycle.

In addition, like steps 2 to 13 as described above, steps 15 to 26 are repeated to form a second chemical adsorption layer that corresponds to six atomic layers on the first nitride film and plasma nitriding is carried out on the second chemical adsorption layer that corresponds to the six atomic layers (step 27). That is, steps 15 to 27 become the next one cycle. In this manner, the second nitride film is formed.

The second nitride film is formed on the first nitride film as described above and then, a required number of cycles of the gas adsorption and the plasma nitriding are repeated so as to obtain a desired film thickness. Then, a nitride film having a desired film thickness and formed on the substrate may be obtained.

In addition, in the above-described exemplary embodiment, a first raw material gas exhaust process is included between a first raw material gas supply process and a second raw material gas supply process. However, the present disclosure is not limited thereto and may be configured such that only the exhaust of the first raw material gas is carried out by supplying the second raw material gas. Further, although the second raw material gas exhaust process is included after the second raw material gas supply process, the present disclosure is not limited thereto and may be configured such that only the exhaust of the second raw material gas is carried out in the first raw material gas supply process or a plasma processing gas supply process.

In the above-described exemplary embodiment, when carrying out a raw material gas supply process, a cover member configured to cover the top of the support unit and the raw material gas may be supplied to the space covered by the cover member. In this manner, the amount of the raw material gas may be reduced and a time may be shortened so that film forming may be carried out more efficiently.

In the above-described exemplary embodiment, the first and second raw material gases are alternately supplied so that the first chemical adsorption layers by the supply of the first raw material gas and the second chemical adsorption layers by the supply of the second raw material gas are alternately formed. However, the present disclosure is not limited thereto, and a third raw material gas that is different from the first and second raw material gases may be supplied between the first and second raw materials so that a third chemical adsorption layer is by the supply of the third raw material gas may be formed. Moreover, different kinds of raw material gases may be used. That is, the present disclosure forms a chemical adsorption layer by supplying two or more kinds of different raw material gases and then carrying out a plasma processing on the chemical adsorption layer so as to form a film.

In the above-described exemplary embodiment, the plasma processing is carried out using a microwave by radial line slot antenna using a slot antenna plate. However, the present disclosure is not limited thereto and may use a microwave plasma processing apparatus having a comb-type antenna unit or a magnetron type plasma processing apparatus.

Although exemplary embodiments of the present disclosure have been described above with reference to drawings, the present disclosure is not limited to the exemplary embodiments illustrated in the drawings. Various modifications or changes may be made on the illustrated exemplary embodiments within the scope which is the same as or equivalent to that of the present disclosure.

DESCRIPTION OF SYMBOLS

11: MOS type semiconductor device
12: silicon substrate
13: element isolation region
14a: p-type well
14b: n-type well
15a: high density n-type impurity diffusion region
15b: high density p-type impurity diffusion region
16a: n-type impurity diffusion region
16b: p-type impurity diffusion region
17: gate oxide film
18: gate electrode
19: gate side wall
21: insulation film
22: contact hole
23: hole filling electrode
24: metal wiring layer
26, 27: region
29: heater
30, 50: gas supply hole
31: plasma processing apparatus
32: processing container
33: gas supply unit
34: support unit
35: microwave generator
36: dielectric window
37: slot antenna plate
38: dielectric member
39: plasma generating mechanism
40: slot
41: bottom portion
42: side wall
43: exhaust opening
44: cover unit
45: O-ring
46, 47: gas supply section
48: bottom surface
49: gas supply system
51: cylindrical support
52: cooling jacket
53: matching mechanism
54: mode converter
55: waveguide
56: coaxial waveguide
57: recess
58: high frequency power supply
59: matching unit
60: circulation path
61: electrode

What is claimed is:

1. A method of forming a film on a substrate to be processed, the method comprising:
supplying a first raw material gas over the substrate so that a first chemical adsorption layer that is adsorbed on the substrate by means of the first raw material gas is formed on the substrate;
supplying a second raw material that is different from the first raw material gas over the substrate on which the first chemical adsorption layer is formed so that a second chemical adsorption layer that is adsorbed by means of the second raw material gas is formed on the first chemical adsorption layer; and
carrying out a plasma processing on at least the first and second chemical adsorption layers using microwave plasma,
wherein the supplying the first raw material gas includes supplying a gas including $Si_2Cl_6$ (hexachlorodisilane), and
the supplying the second raw material gas includes supplying a gas including $SiH_4$ (silane) having hydrogen bonds.

2. The method of claim 1, further comprising:
exhausting the first raw material gas after the supplying the first raw material gas and prior to the supplying the second raw material gas.

3. The method of claim 1, further comprising:
exhausting the second raw material gas after the supplying the second raw material gas.

4. The method of claim 1, wherein the supplying the first raw material gas includes supplying a gas that contains a halogenide.

5. The method of claim 1, wherein the microwave plasma is generated by a radial line slot antenna.

6. The method of claim 1, wherein the plasma processing uses microwave plasma that has an electron temperature lower than 1.5 eV and an electron density higher than $1 \times 10^{11}$ cm$^{-3}$ in the vicinity of a surface of the substrate.

7. The method of claim 1, wherein the film formed on the substrate is a nitride film or an oxide film.

* * * * *